(12) United States Patent
Chen et al.

(10) Patent No.: US 7,515,083 B2
(45) Date of Patent: Apr. 7, 2009

(54) ANALOG-TO-DIGITAL CONVERTING SYSTEM

(75) Inventors: Bo-Wei Chen, Miaoli County (TW);
Szu-Kang Hsien, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/941,981

(22) Filed: Nov. 19, 2007

(65) Prior Publication Data

US 2008/0143576 A1    Jun. 19, 2008

Related U.S. Application Data

(60) Provisional application No. 60/870,606, filed on Dec. 18, 2006.

(51) Int. Cl.
*H03M 1/14* (2006.01)
*H03M 1/36* (2006.01)
*H03M 1/46* (2006.01)

(52) U.S. Cl. .................. 341/156; 341/159; 341/162

(58) Field of Classification Search ............... 341/156, 341/158, 159, 160, 161, 162, 163
See application file for complete search history.

(56) References Cited

U.S. PATENT DOCUMENTS

| | | | |
|---|---|---|---|
| 4,200,863 A | | 4/1980 | Hodges et al. |
| 4,641,129 A | * | 2/1987 | Doluca et al. ............... 341/156 |
| 4,994,806 A | | 2/1991 | Yun-Tae |
| 5,138,319 A | * | 8/1992 | Tesch ........................ 341/156 |
| 5,247,301 A | | 9/1993 | Yahagi et al. |
| 5,675,340 A | * | 10/1997 | Hester et al. ................ 341/156 |
| 5,973,632 A | | 10/1999 | Tai |
| 6,124,818 A | | 9/2000 | Thomas et al. |
| 6,340,943 B1 | * | 1/2002 | Chow et al. ................. 341/161 |
| 6,608,580 B2 | * | 8/2003 | Hsueh ........................ 341/163 |
| 6,828,927 B1 | * | 12/2004 | Hurrell et al. .............. 341/156 |
| 7,038,609 B1 | * | 5/2006 | Hurrell ....................... 341/156 |
| 7,394,421 B2 | * | 7/2008 | Morisson .................... 341/159 |

* cited by examiner

*Primary Examiner*—Howard Williams
(74) *Attorney, Agent, or Firm*—Jianq Chyun IP Office

(57) ABSTRACT

A novel analog-to-digital converter (ADC) architecture using subranging successive approximation approach is disclosed. The ADC architecture is capable of achieving high sampling rate, low power consumption and low complexity. It is also able to advance the chip production yield and area utilization ratio. The new proposed ADC is formed by combining a flash converter having high sampling rate and low resolution with a successive approximation converter having low power consumption and low sampling rate.

20 Claims, 9 Drawing Sheets

ANALOG-TO-DIGITAL CONVERTING SYSTEM

CROSS-REFERENCE TO RELATED APPLICATION

This application claims the priority benefit of U.S. provisional application Ser. No. 60/870,606, filed on Dec. 18, 2006, all disclosures are incorporated herein by reference.

BACKGROUND OF THE INVENTION

1. Field of the Invention

The present invention generally relates to an analog-to-digital converting system, and more particularly, to an analog-to-digital converting system by using subranging successive approximation (SAR) approach.

2. Description of Related Art

Analog-to-digital converters (ADC) have various architectures, for example, flash analog-to-digital converters (flash ADC), pipeline analog-to-digital converters (pipeline ADC), successive approximation analog-to-digital converters (SA-ADC) and two-steps analog-to-digital converters (two-steps ADC), all of which respectively have suitable application fields.

Flash ADCs are usually used in applications with high sampling rates, but they come with disadvantages of high power consumption. SA-ADCs are limited by lower sampling frequency, but they have advantages of low power consumption and low circuit complexity.

Characteristics of pipeline ADCs are between flash ADCs and SA-ADCs. In particular, pipeline ADCs require to employ multiplier digital-to-analog converters (MDAC), while MDACs include residue operation amplifiers therein, which are characterized by negative feedback architecture. Thus, the residue operation amplifiers appear to be a bottleneck for pipeline ADCs to be used in high speed sampling applications.

Two-steps ADCs can be categorized into bit-cycling analog-to-digital converters (bit-cycling ADC) and subranging analog-to-digital converters (subranging ADC). Bit-cycling ADCs require residue operation amplifiers as well and have problems similar to pipeline ADCs. According to the so far references however, subranging ADCs are capable of breaking through the limitations on pipeline ADCs and two-steps ADCs adopting bit-cycling architecture and capable of reaching high speed sampling.

Several conventional ADC systems are respectively introduced hereinafter.

The first conventional ADC system is disclosed in U.S. Pat. No. 6,124,818, which uses pipeline approach so as to largely enhance the operation capability. In this prior art, a two-steps ADC architecture is adopted, and both the coarse analog-to-digital converter (coarse ADC) and the fine analog-to-digital converter (fine ADC) therein take SA-ADC architecture, so that the resolution demand by the digital-to-analog converter (DAC) is lowered, the circuit area of the DAC gets less and the data-converting speed is advanced. However, due to the coarse ADC is SA-ADC, the first conventional ADC system has long latency and slow sampling frequency.

The second conventional ADC system is disclosed in U.S. Pat. No. 5,973,632, which uses two-steps ADC approach, and both coarse ADC and fine ADC use a flash architecture for converting data so as to advance the data-converting speed of the ADC. Because the fine ADC adopts the flash architecture, the required number of comparators is $(2^{MSBs}+2^{LSBs}-2)$ where MSBs and LSBs respectively represent a most-significant-bit set and a least-significant-bit set. Thus, the second conventional ADC system is disadvantageous in high quantity of the comparators, high circuit complexity, high power consumption and low area utilization ratio.

The third conventional ADC system is disclosed in U.S. Pat. No. 5,675,340, which uses two-steps ADC approach, and both coarse ADC and fine ADC use an SA-ADC architecture; the required number of comparators is $2^{MSBs}$ only. Thus, the third conventional ADC system has low power consumption and small chip area. However, the adder in the third conventional ADC system makes the DAC data-converting time long, thus it is not suitable for a high speed converting architecture. In addition, without adopting the subranging technique, the MSBs obtained by the coarse ADC must be transmitted to the DAC inside the SA-ADC. Accordingly, the DAC inside the SA-ADC has large circuit area (due to more unit capacitors are included herein). Besides, the DAC insides the SA-ADC has high equivalent input capacitance and slow sampling frequency.

The fourth conventional ADC system is disclosed in U.S. Pat. No. 5,247,301. Referring to FIG. 1, which is a diagram of the ADC system provided by U.S. Pat. No. 5,247,301. As shown by FIG. 1, a two-steps ADC mainly includes a high bit comparator set 1, a high bit sample/hold circuit set 2, a high bit encoder 3, a low bit comparator set 4, a low bit sample/hold circuit set 5, a low bit encoder 6, a reference voltage generator 7, a control signal generator 8 and a buffer 9.

The high bit comparator set 1 includes multiple comparators 1-1~1-m to compare reference voltages VH-1~VH-m with an input voltage Vin. The high bit S/H circuit set 2 includes multiple S/H circuits 2-1~2-m, wherein each S/H circuit includes switches S2 and S21 and a capacitor Ci. The high bit S/H circuit set 2 performs sampling/holding on the input voltage Vin and sends the result to the high bit comparator set 1. The high bit encoder 3 encodes the comparison result of the high bit comparator set 1 into high bit set DoH.

Similarly, the low bit comparator set 4 includes multiple comparators 4-1~4-n to compare reference voltages VL-1~VL-n with the input voltage Vin. The low bit S/H circuit set 5 includes multiple S/H circuits 5-1~5-n, wherein each S/H circuit includes switches S5 and S51 and a capacitor Ci. The low bit S/H circuit set 5 performs sampling/holding on the input voltage Vin and sends the result to the low bit comparator set 4. The low bit encoder 6 encodes the comparison result of the low bit comparator set 4 into low bit set DoL.

The reference voltage generator 7 generates high bit reference voltages VH-1~VH-m to the high bit comparator set 1. In addition, the reference voltage generator 7 generates low bit reference voltages VL-1~VL-n to the low bit comparator set 4.

The control signal generator 8 respectively generates control signals φm to the analog switch Sm and control signals φs to the high bit S/H circuit set 2 and the low bit S/H circuit set 5.

The analog switch Sm controls on/off status between the input voltage Vin and the high bit S/H circuit set 2 together with the low bit S/H circuit set 5.

The fourth conventional ADC architecture combines the two-steps ADC and the subranging ADC. The fourth conventional ADC architecture has high data-converting speed, but more comparators, which comes with high circuit complexity, high power consumption, low production yield and low area utilization ratio.

The fifth conventional ADC system is disclosed in U.S. Pat. No. 4,994,806, which uses a flash ADC (with high speed converting feature) to advance the ADC converting speed. SA-ADC architecture is also used to advance the ADC accuracy. Thus, the fifth conventional ADC system absorbs the advantages both of flash ADC and SA-ADC so as to enhance the overall efficiency of the ADC without additional correction circuit. However, since a residue amplifier is employed, the residue amplifier would become a bottleneck of the entire ADC system in case the ADC is operated in high converting frequency.

SUMMARY OF THE INVENTION

Accordingly, one example of the present invention is directed to provide an ADC system to convert an analog input signal into a digital output signal. The ADC system includes: a track and hold circuit (T/H circuit) for tracking and holding the tracked input signal; a coarse ADC to convert an output signal from the T/H circuit into a first digital code according to a first reference voltage, wherein the first digital code is a most-significant-bit set related to the digital output signal; an encoding and registering unit for storing the first digital code and a second digital code, wherein the second digital code is related to the least-significant-bit set of the digital output signal and the encoding and registering unit encodes the first digital code into a third digital code; a reference voltage generator to generate the first reference voltage to the coarse ADC, wherein the reference voltage generator generates a second reference voltage according to the third digital code output from the encoding and registering unit; and a SA-ADC to receive the output signal of the T/H circuit. The SA-ADC uses a successive approximation algorithm to convert the output signal of the T/H circuit into the second digital code according to the second reference voltage.

Another example of the present invention is directed to provide an analog-to-digital converting system, for converting a differential analog input signal into a digital output signal, the analog-to-digital converting system comprising: a track and hold circuit for tracking the input signal and holding the tracked input signal; a coarse analog-to-digital converter for converting an output signal of the track and hold circuit into a first digital code according to a first reference voltage, wherein the first digital code is related to a most-significant-bit set of the digital output signal of the analog-to-digital converting system; an encoding and registering unit for storing the first digital code and a second digital code, wherein the second digital code is related to a least-significant-bit set of the digital output signal of the analog-to-digital converting system and the encoding and registering unit encodes the first digital code into a third digital code; a reference voltage generator for generating the first reference voltage provided to the coarse analog-to-digital converter, wherein the reference voltage generator further generates a second reference voltage according to the third digital code; and a successive approximation analog-to-digital converter for converting the output signal of the track and hold circuit into the second digital code by using a successive approximation algorithm according to the second reference voltage. The successive approximation analog-to-digital converter comprises: a successive approximation register for outputting the second digital code and a fourth digital code; a 2's complement generator for generating a 2's complement of the fourth digital code; a first digital-to-analog converter with sample/hold function for generating a first analog voltage according to the output signal of the track and hold circuit, the second reference voltage and the fourth digital code; a second digital-to-analog converter with sample/hold function for generating a second analog voltage according to the output signal of the track and hold circuit, the second reference voltage and the 2's complement of the fourth digital code; and a comparator, receiving outputs from the first digital-to-analog converter with sample/hold function and the second digital-to-analog converter with sample/hold function to generate an output signal provided to the successive approximation register and the 2's complement generator, wherein the output signal of the comparator is for updating the second digital code, the fourth digital code and the 2's complement of the fourth digital code.

Still another example of the invention is to provide an analog-to-digital converting system, for converting a differential analog input signal into a digital output signal, the analog-to-digital converting system comprising: a track and hold circuit for tracking the input signal and holding the tracked input signal; a coarse analog-to-digital converter for converting an output signal of the track and hold circuit into a first digital code according to a first reference voltage, wherein the first digital code is related to a most-significant-bit set of the digital output signal of the analog-to-digital converting system; an encoding and registering unit for storing the first digital code and a second digital code, wherein the second digital code is related to a least-significant-bit set of the digital output signal of the analog-to-digital converting system and the encoding and registering unit encodes the first digital code into a third digital code; a reference voltage generator for generating the first reference voltage provided to the coarse analog-to-digital converter, wherein the reference voltage generator further generates a second reference voltage according to the third digital code; and a successive approximation analog-to-digital converter for converting the output signal of the track and hold circuit into the second digital code by using a successive approximation algorithm according to the second reference voltage. The successive approximation analog-to-digital converter comprises: a successive approximation register for outputting the second digital code and a fourth digital code; a 2's complement generator for generating a 2's complement of the fourth digital code; a first digital-to-analog converter for generating a first analog voltage according to the second reference voltage and the fourth digital code; a second digital-to-analog converter for generating a second analog voltage according to the second reference voltage and the 2's complement of the fourth digital code; and a comparator for comparing the first analog voltage with the output signal of the track and hold circuit and for comparing the second analog voltage with the output signal of the track and hold circuit so as to generate an output signal provided to the successive approximation register and the 2's complement generator, wherein the output signal of the comparator is for updating the second digital code, the fourth digital code and the 2's complement of the fourth digital code.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
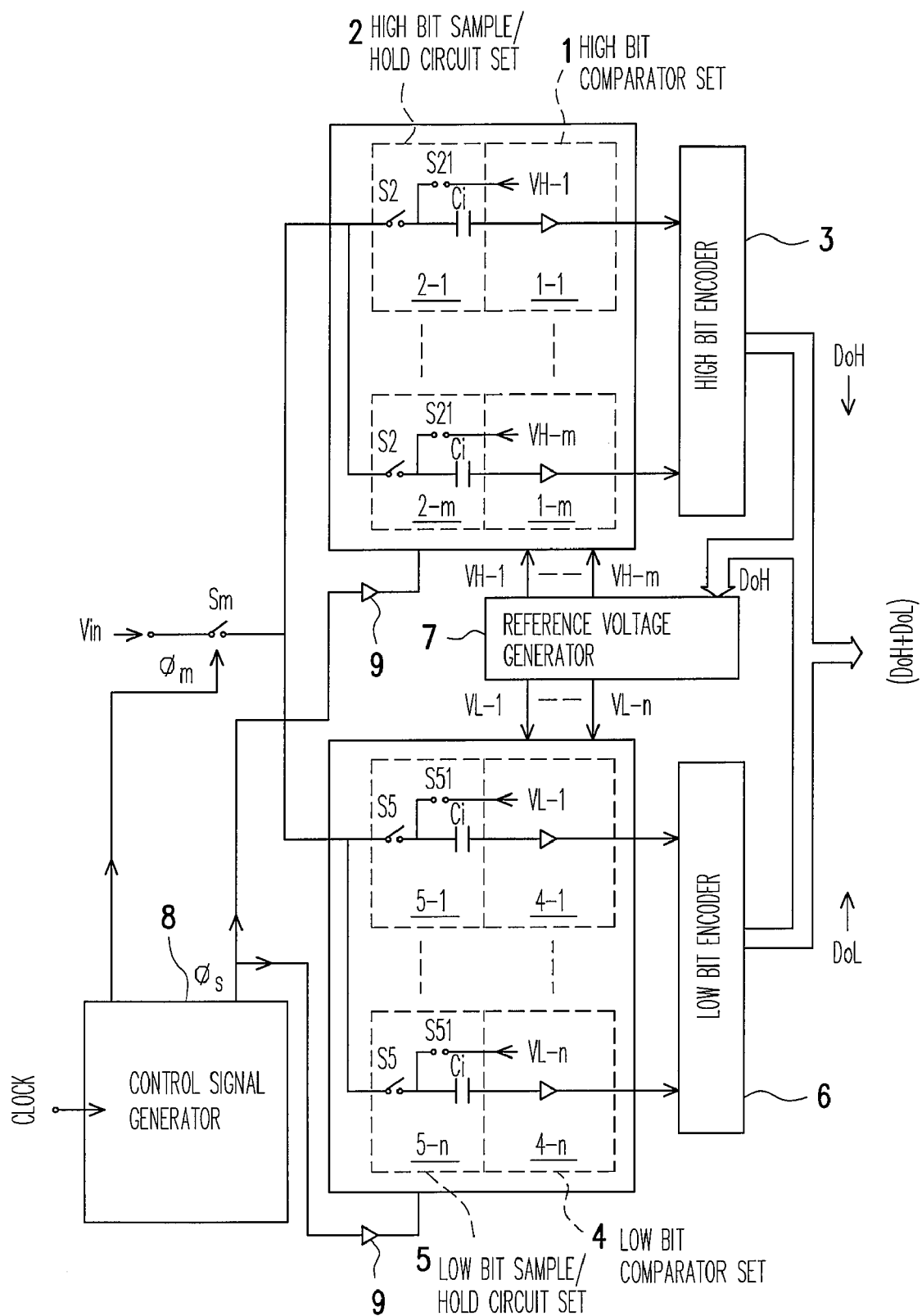
FIG. 1 is a typical diagram of the ADC system provided by the U.S. Pat. No. 5,247,301.

Reference will now be made in detail to the present preferred embodiments of the invention, examples of which are illustrated in the accompanying drawings. Wherever possible, the same reference numbers are used in the drawings and the description to refer to the same or like parts.

In the several embodiments of the present invention, the ADC systems adopt subranging technique based on the two-steps architecture, wherein the coarse ADC takes a flash ADC architecture, while the fine ADC takes an SA-ADC architecture. Thus, the embodiments are advantageous in high speed sampling frequency and low power consumption.

The embodiments use, a binary successive approximation algorithm, which is different from the traditional binary successive approximation algorithm.

Figure 2:
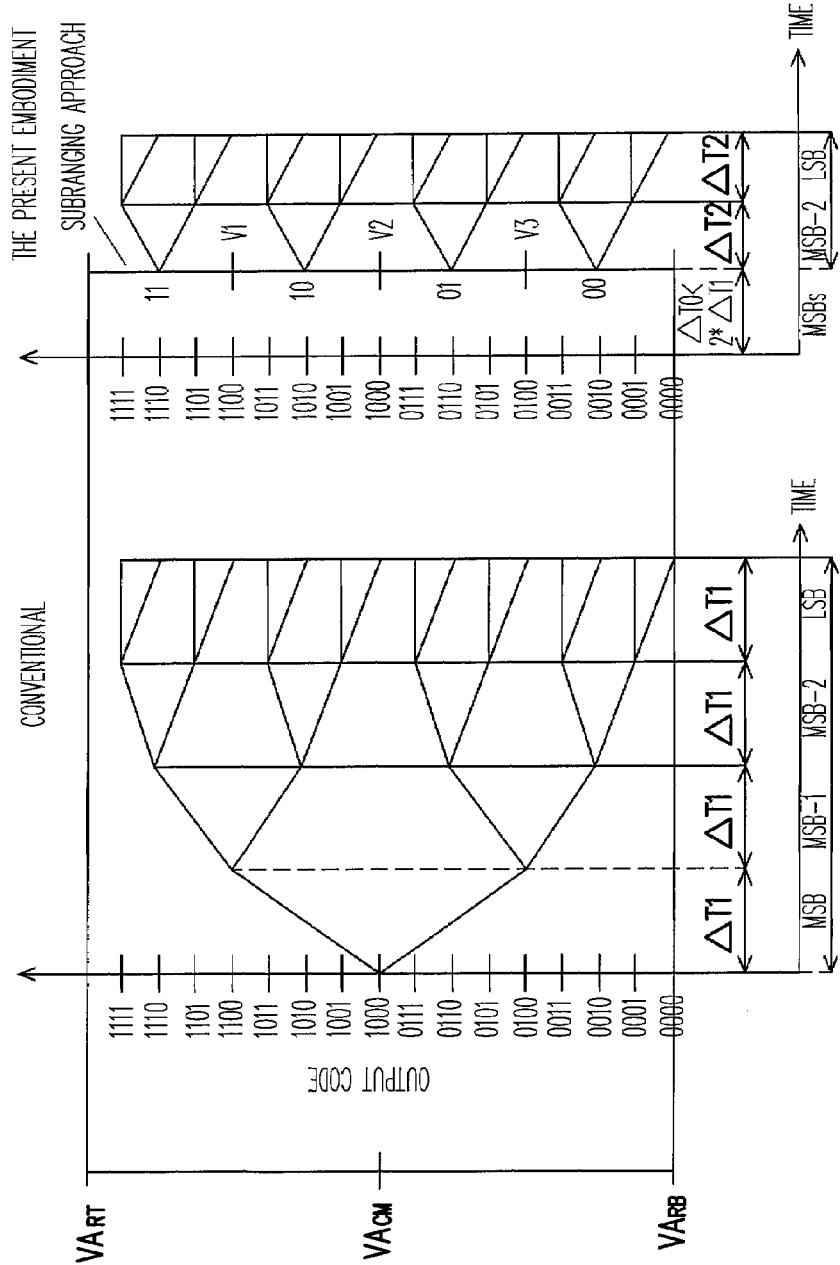
FIG. 2 is a diagram where a conventional binary successive approximation converting algorithm and the novel binary successive approximation converting algorithm of the present invention are illustrated.

Referring to FIG. 2, which compares a conventional binary successive approximation converting algorithm and the binary successive approximation converting algorithm of the present invention, where a 4-bits data-converting with a synchronization timing control approach is exemplarily depicted.

As shown by FIG. 2, the traditional binary successive approximation algorithm requires four time intervals $\Delta T1$ to accomplish data-converting of four bits (MSB, MSB-1, MSB-2 and LSB). The time internal $\Delta T1$ depends on the slowest data-converting, which is related to a charge redistribution time.

In comparison with the traditional one, in the binary successive approximation algorithm adopted by the embodiments of the present invention, the 4-bits data-converting includes data-converting of most-significant-bit MSBs by coarse ADC and data-converting of least-significant-bit set, i.e. MSB-2 and LSB by fine ADC, wherein since the coarse ADC adopts flash ADC architecture, the data-converting speed is very high and the time interval $\Delta T0$ required by converting MSBs may be less than $2 \times \Delta T1$; while since the fine ADC is in charge of LSBs converting by subranging technique, the charge redistribution time is reduced for four times, that is to say, $\Delta T1 = 4 \times \Delta T2$. In this way, the entire converting speed may be significantly advanced.

First Embodiment

Figure 3:
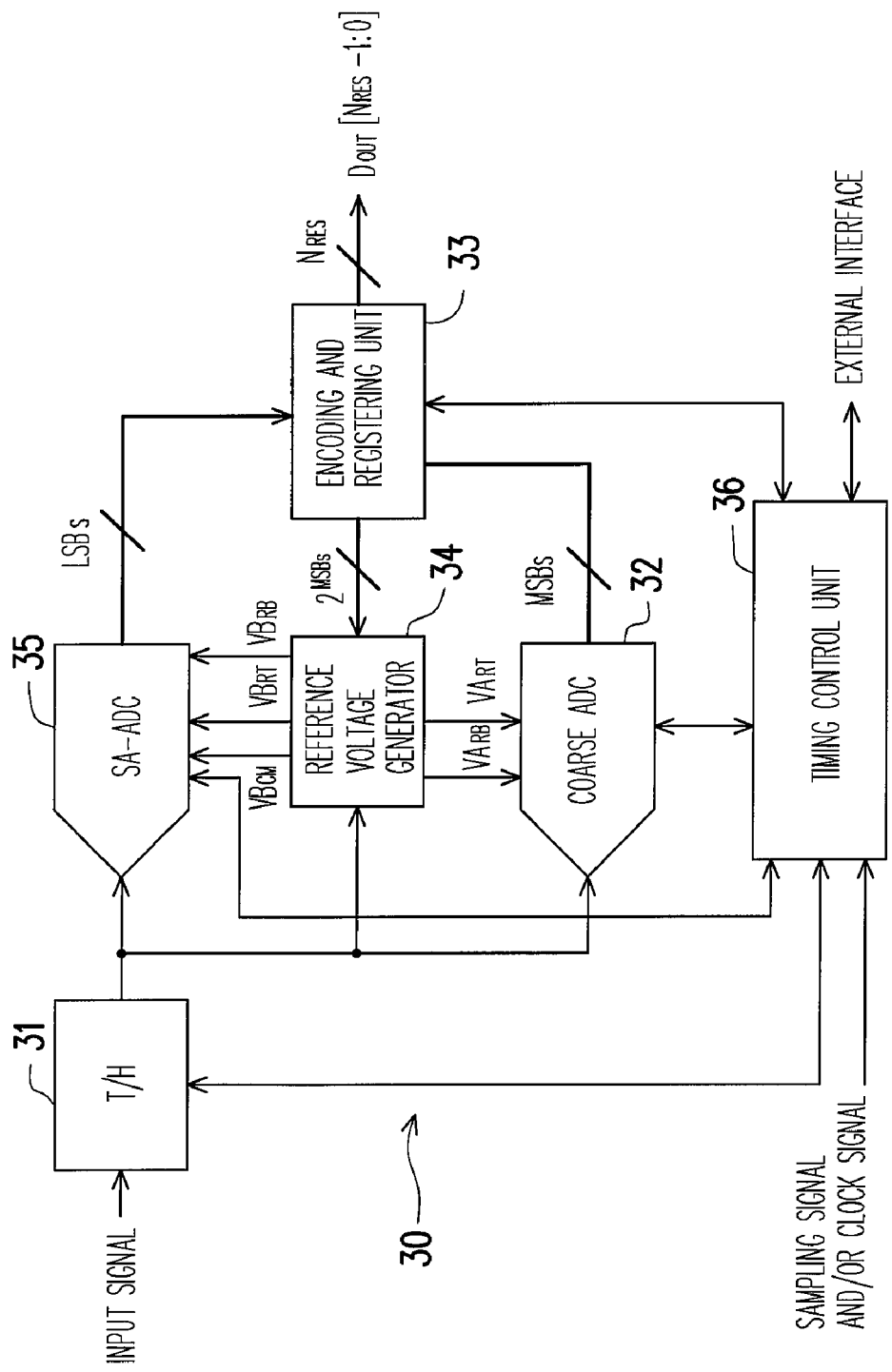
FIG. 3 is a circuit block diagram of an ADC system according to the first embodiment of the present invention.

Referring to FIG. 3, which is a circuit block diagram of an ADC system according to the first embodiment of the present invention. The ADC system of FIG. 3 includes a track and hold circuit (T/H circuit) 31, a coarse ADC 32, an encoding and registering unit 33, a reference voltage generator 34, an SA-ADC 35 and a timing control unit 36.

During a track mode, the T/H circuit 31 would track an input signal. During a hold mode, the T/H circuit 31 would hold the tracked input signal and deliver the input signal to rear-stage circuits (the coarse ADC 32, the SA-ADC 35 and the reference voltage generator 34).

The coarse ADC 32 receives the output signal of the T/H circuit 31, conducts high bit data-converting to generate digital code MSBs and delivers the digital code MSBs to the encoding and registering unit 33. The digital code MSBs is related to the most-significant-bit set MSBs of the final result $D_{OUT}[N_{RES}-1:0]$. The digital code MSBs converted by the coarse ADC 32 is in type of, for example, Gray code. The coarse ADC 32 has flash ADC architecture and thus has an error-correcting function. In the first embodiment, the architecture of the coarse ADC is not limited as long as the above-mentioned function is reached.

The encoding and registering unit 33 saves MSBs and LSBs (generated by the SA-ADC 35), wherein the encoding and registering unit 33 converts the MSBs (Gray code) into $2^{MSBs}$ (i.e., 1-of-n code) and sends the $2^{MSBs}$ to the reference voltage generator 34 so as to make the reference voltage generator 34 to generate reference voltages VB ($VA_{RT}$, $VA_{RB}$ and $VB_{CM}$). The bit number of $N_{RES}$ is equal to the bit number sum of MSBs and LSBs. When the SA-ADC 35 obtains a final LSBs, the encoding and registering unit 33 would generate a final result (output signal) $D_{OUT}[N_{RES}-1:0]$, where the bit numbers of MSBs and LSBs are not necessarily to be the same.

The reference voltage generator 34 generates stable reference sources VA ($VA_{RT}$ and $VA_{RB}$) to the coarse ADC 32. The reference voltage generator 34 generates the reference voltages VA to the SA-ADC 35 according to the digital code $2^{MSBs}$ sent by the encoding and registering unit 33. When the input signal is a full-differential signal, the reference voltage generator 34 may detect the common mode voltage of the output signal of the T/H circuit 31 to ensure the accuracy of the reference voltages.

The SA-ADC 35 receives the output signal of the T/H circuit 31 and uses the successive approximation algorithm to conduct low bit data-converting for generating LSBs and sending LSBs to the encoding and registering unit 33.

Referring to FIG. 2 again, MSBs converted by the coarse ADC 32 is related to the reference sources $VA_{RT}$ and $VA_{RB}$ (which are provided to the SA-ADC 35). They are mapped to each other as shown by the following table:

| MSB | ($VA_{RT}$, $VA_{RB}$) |
|---|---|
| 11 | ($VA_{RT}$, V1) |
| 10 | (V1, V2) |
| 01 | (V2, V3) |
| 00 | (V3, $VA_{RB}$) |

In addition, note that the difference between $VA_{RT}$ and $VA_{RB}$ is a fixed value no matter what values the MSBs are.

The timing control unit 36 generates a control signal so as to make proper operation timing of the units 31-35. The timing control unit 36 may use synchronization or asynchronization timing control approach to control the units 31-35. The timing control unit 36 receives the sampling signal and/or the clock signal received from outside. In particular, when the units 31-35 are controlled by the synchronization timing control approach, an external clock signal is required; when the units 31-35 are controlled by the a synchronization timing control approach, an external clock signal is not required. The timing control unit 36 is also in charge of communicating with an external interface.

The operation principle of FIG. 3 is explained in the following, where assuming the resolution of the ADC of FIG. 3 is four bits, while both the MSBs and LSBs are of two bits.

Referring to FIGS. 2 and 3, in ΔT0, the coarse ADC 32 converts and generates MSBs which is assumed as 01. Then, the reference voltage generator 34 would generate the reference voltage VB to the SA-ADC 35 according to MSBs. After that, during first ΔT2, the SA-ADC 35 converts and generates high bit of LSBs; and during second ΔT2, the SA-ADC 35 converts and generates low bit of LSBs. Finally, the encoding and registering unit 33 would combine MSBs with LSBs into $D_{OUT}$ so the ADC converting is done.

The Second Embodiment

Figure 4:
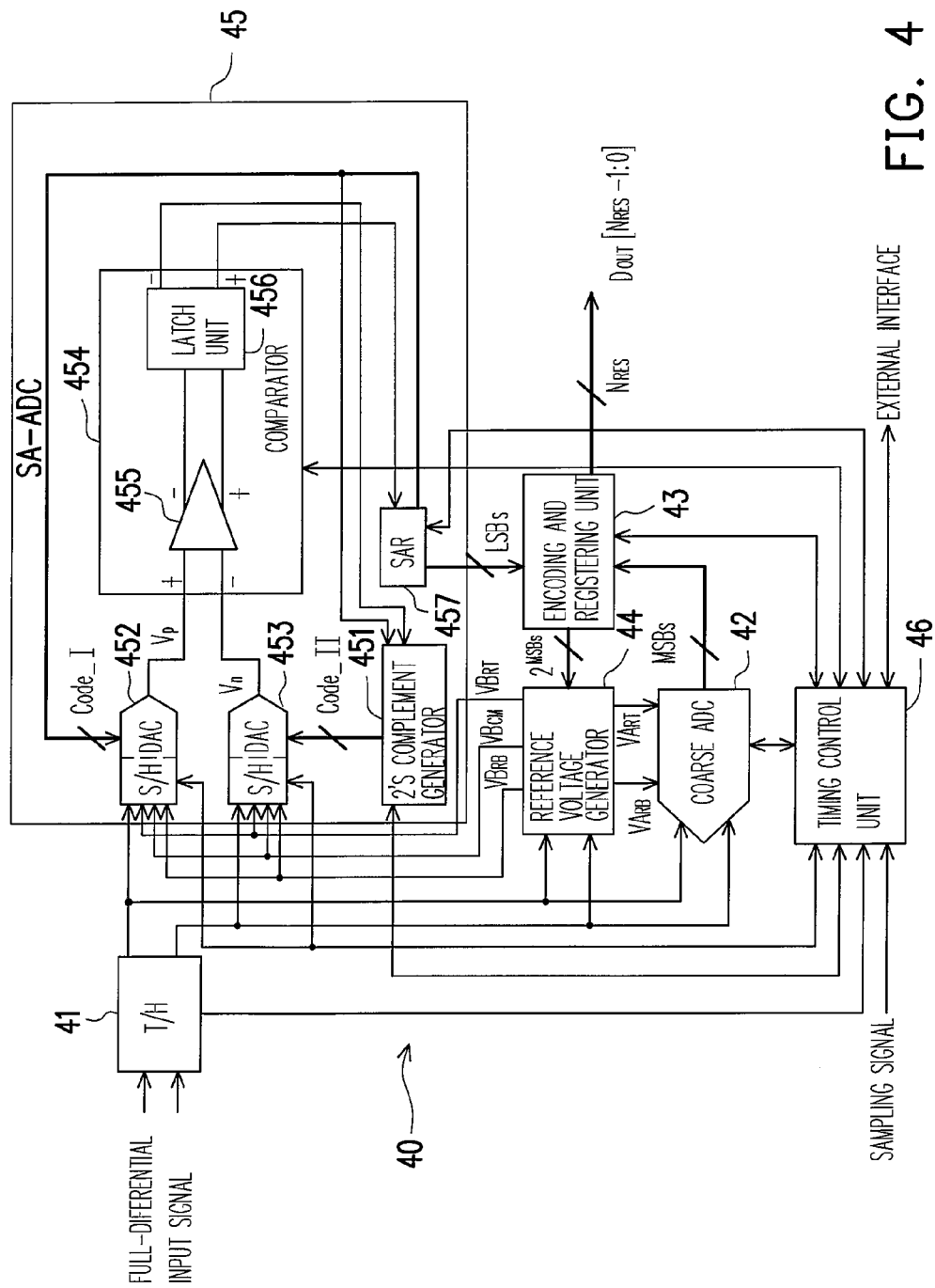
FIG. 4 is a circuit block diagram of an ADC system according to the second embodiment of the present invention.

Referring to FIG. 4, which is a circuit block diagram of an ADC system according to the second embodiment of the present invention. An ADC system 40 of FIG. 4 includes a T/H circuit 41, a coarse ADC 42, an encoding and registering unit 43, a reference voltage generator 44, an SA-ADC 45 and a timing control unit 46. The timing control unit 46 controls the units 41-45 and their internal sub-circuits in asynchronization timing control approach, therefore, the timing control unit 46 may not need an external clock signal. FIG. 4 is suitable for the case where the input signal is a full-differential input signal.

The SA-ADC 45 includes a 2's complement generator 451, digital-to-analog converters (DACs) with sample/hold function 452 and 453, a comparator 454 and an SAR 457. The comparator 454 includes a preamplifier 455 and a latch unit 456. The comparator 454 has a deviation-correcting function.

Under control of digital codes Code_1 and Code_II (Code_II is the complement of Code_I), the DACs 452 and 453 would generate analog voltages Vp and Vn according to the output signal of the T/H circuit 41 and reference voltages $VB_{RB}$ and $VB_{RT}$. The DACs 452 and 453 conduct converting as the explained in the following.

The preamplifier 455 amplifies the analog voltages Vp and Vn. The latch unit 456 latches the output signal of the preamplifier 455 into a digital output signal, which is then sent to the SAR 457 and the 2's complement generator 451 so as to update the digital codes Code_1 and Code_II during bit cycling.

The architecture of the SAR 457 is, for example but not limited to, a combination of shift register and logic circuit.

Figure 5:
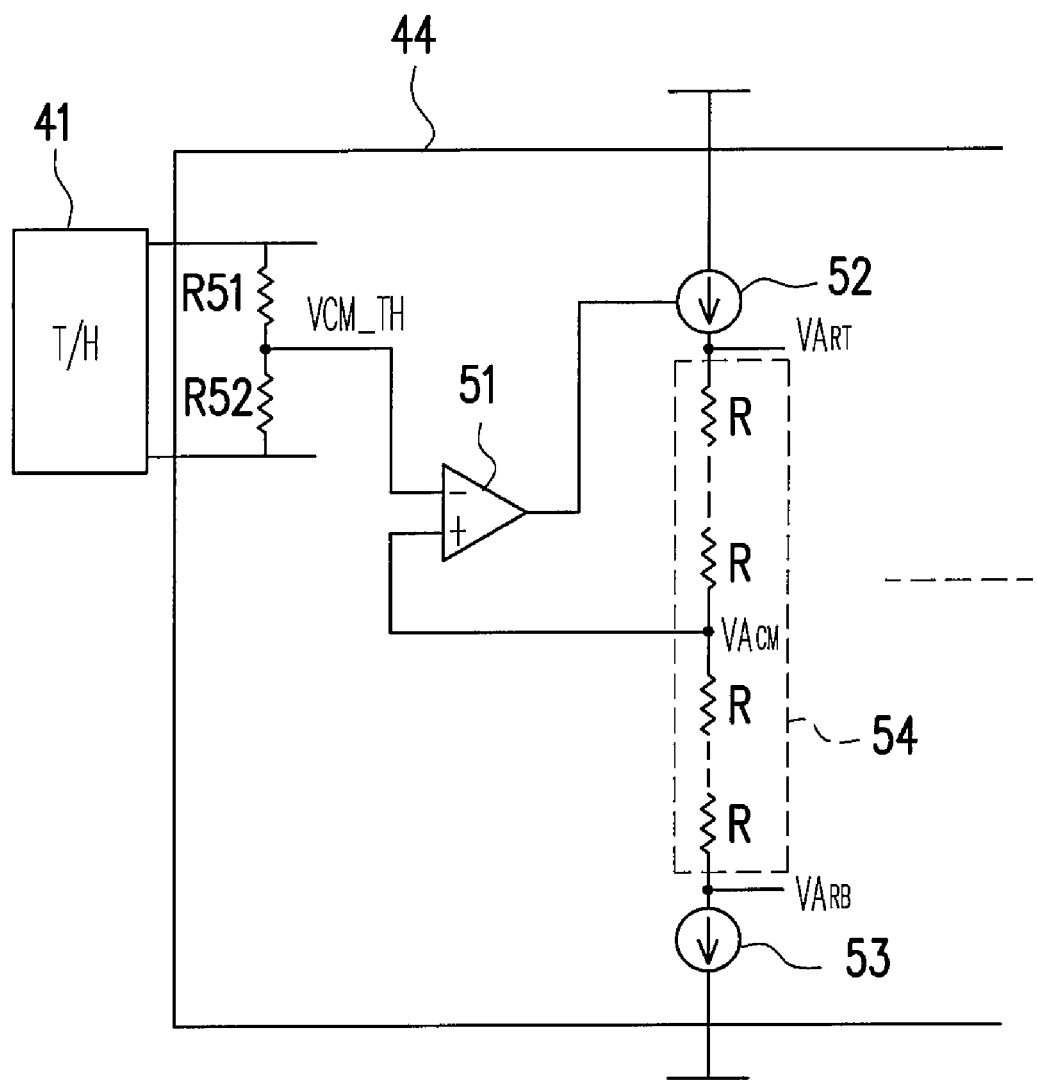
FIG. 5 is a diagram showing how the reference voltage generator in FIG. 4 tracks the common mode voltage of the output signal from the T/H circuit.

Referring to FIG. 5, which is a diagram showing a part of the reference voltage generator 44 in FIG. 4, for tracking the common mode voltage VCM_TH of the output signal from the T/H circuit 41. This part of the reference voltage generator 44 includes resistors R51 and R52, an amplifier 51, current sources 52 and 53 and a resistor string 54. The resistor string 54 includes a plurality of resistors R in series connection.

As shown by FIG. 5, the resistors R51 and R52 are for extracting the common mode voltage VCM_TH from the output signal of the T/H circuit 41. The common mode voltage VCM_TH then is sent to a terminal of the amplifier 51 where another terminal thereof is connected to another common mode voltage $VA_{CM}$. The output signal of the amplifier 51 is for controlling the current source 52. By using the negative feedback mechanism established by the components 51-54, the common mode voltage $VA_{CM}$ can track the common mode voltage VCM_TH.

Figure 6:
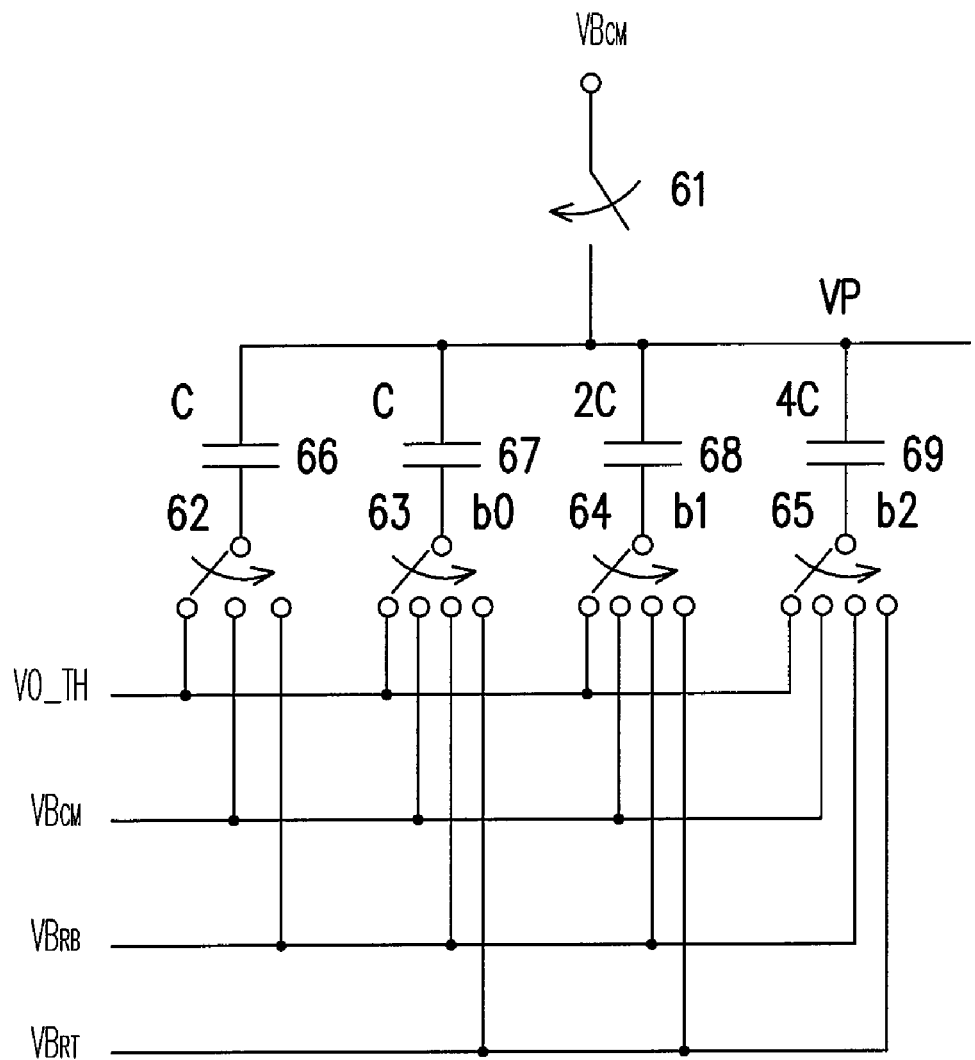
FIG. 6 is a diagram of the digital-to-analog converter with sample/hold function of FIG. 4.

Referring to FIG. 6, which is a diagram of the DAC 452 with sample/hold function. The DAC 453 has the same architecture as the DAC 452 except for different control codes (bo~b2).

As shown by FIG. 6, the DAC 452 includes switches 61-65 and capacitors 66-69. In the embodiment, the capacitances of the capacitors 66-69 are proportional in 1:1:2:4.

During the reset mode, the switch 61 is turned on and the switches 62-65 are connected to the common mode voltage $VB_{CM}$.

During the sampling duration, the switch 61 is turned on and the switches 62-65 are switched to VO_TH, which is the output voltage of the T/H circuit 41.

During the hold duration, the switch 61 is turned off and the switch 62 is switched to $VB_{RB}$. The switches 63-65 would be switched to $VB_{RB}$ or $VB_{RT}$ according to the bits b0, b1 and b2. For example, when the bit b0 is 0, the switch 63 would be switched to $VB_{RB}$; otherwise, the switch 63 would be switched to $VB_{RT}$. The bits b0-b2 are LSBs.

The voltage Vp can be expressed by:

$$Vp = VB_{CM} - VO\_TH + \Delta V\_MSBs \times (½ \times b2 + ¼ \times b1 + ⅛ \times b0) + VB_{RB} \quad (1)$$

In the equation (1), ΔV_MSBs represents the difference between $VB_{RT}$ and $VB_{RB}$.

Figure 7:
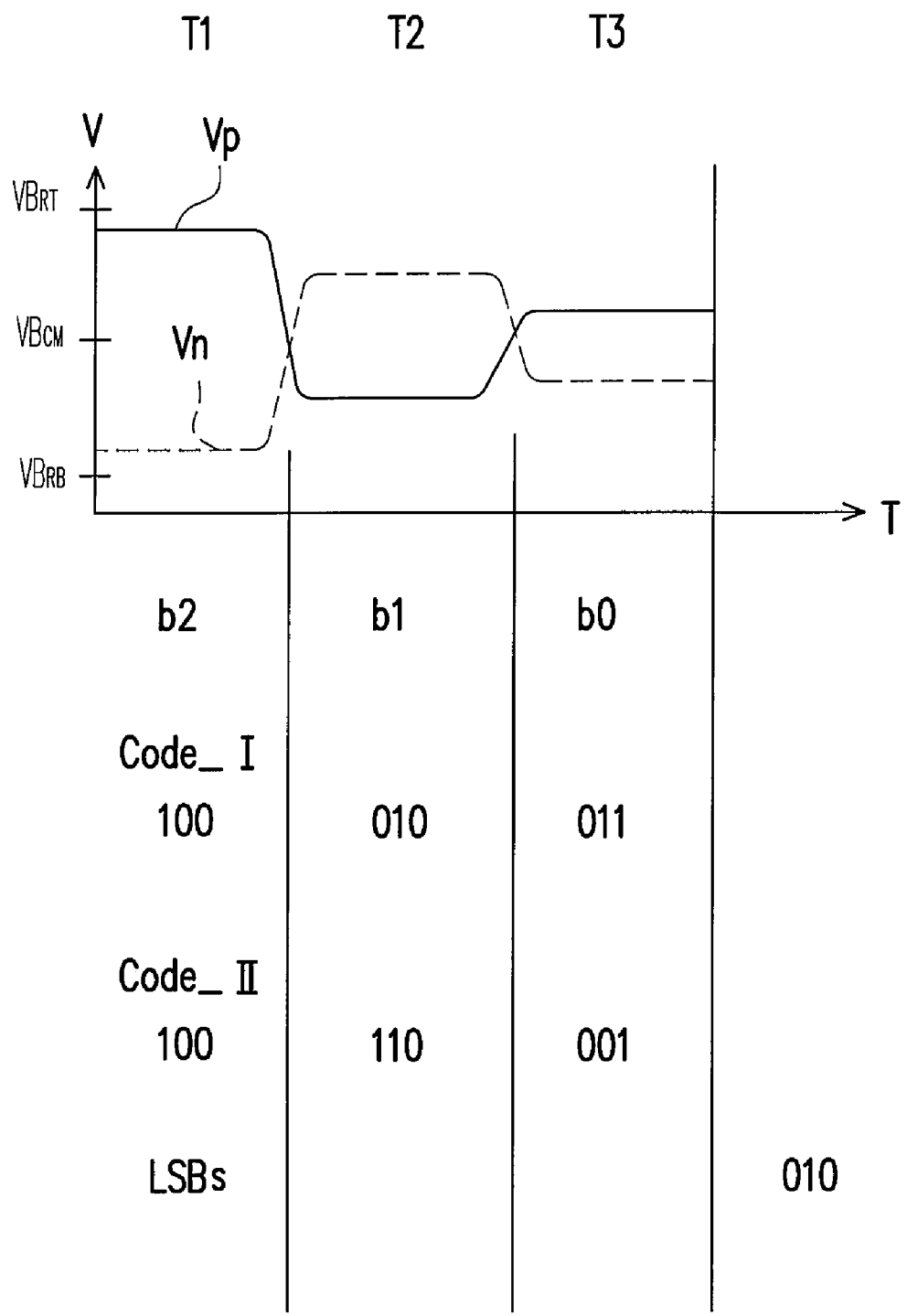
FIG. 7 is an exemplary diagram showing how the architecture of FIG. 4 determines LSBs.

Referring to FIG. 7, which is an exemplary diagram showing how the architecture of FIG. 4 determines LSBs. According to the successive approximation algorithm, default values of both Code_I and Code_II are 100.

During T1 duration, the bit b2 is determined, herein the determined bit b2 is assumed as 0. The determined bit b2 would be saved in both the SAR 457 and the 2's complement generator 451 to update Code_I and Code_II to 010 and 110.

During T2 duration, the bit b1 is determined; during T3 duration, the bit b0 is determined. Similarly, the determined bits b1 and b0 would update Code_I and Code_II, as shown by FIG. 7. After T3 duration, the final values of LSBs are determined.

The architecture of FIG. 4 is applicable to, for example, ultra-wide band (UWB) wireless communication systems.

The Third Embodiment

Figure 8:
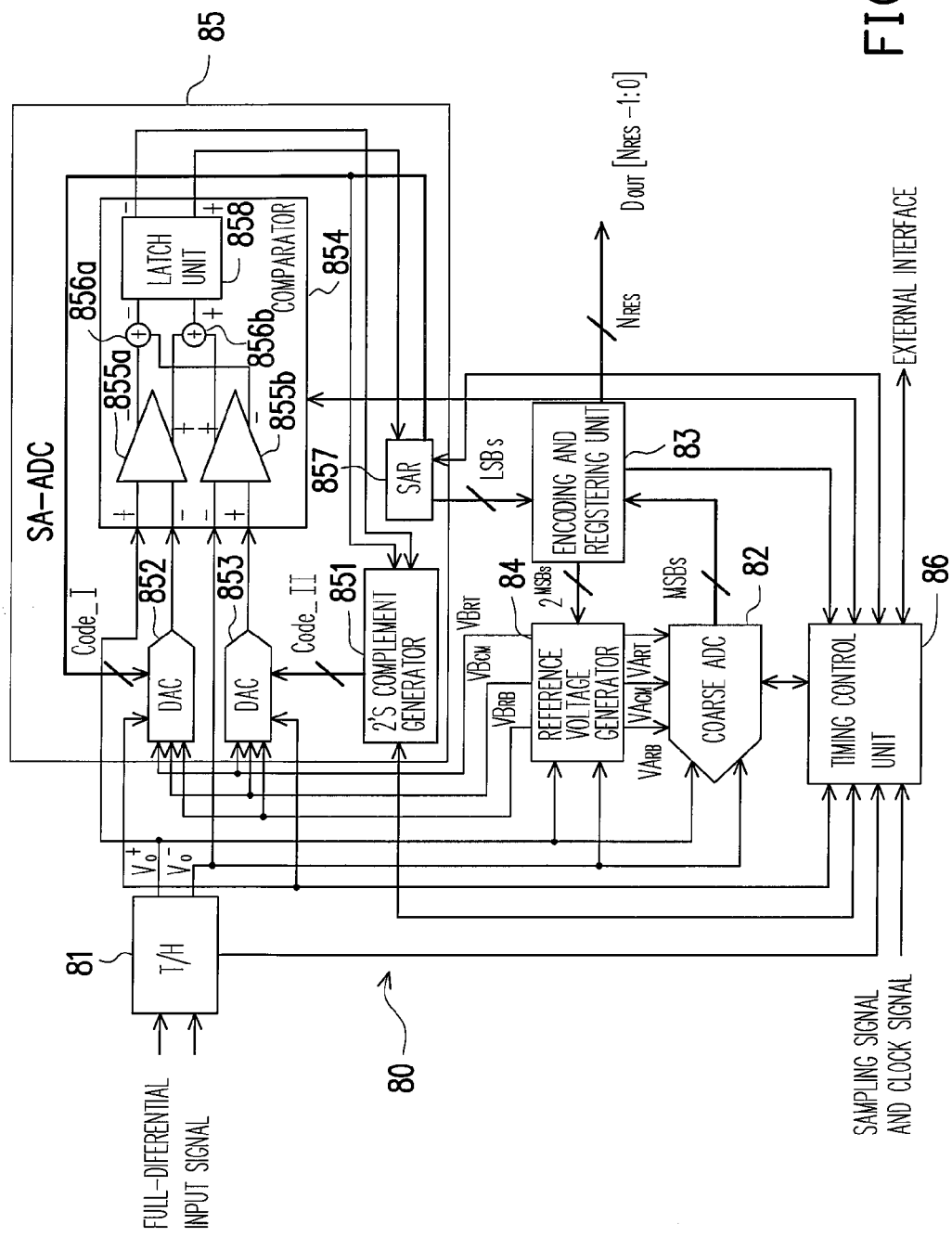
FIG. 8 is a circuit block diagram of an ADC system according to the third embodiment of the present invention.

Referring to FIG. 8, which is a circuit block diagram of an ADC system according to the third embodiment of the present invention. As shown by FIG. 8, an ADC system 80 includes a T/H circuit 81, a coarse ADC 82, an encoding and registering unit 83, a reference voltage generator 84, an SA-ADC 85 and a timing control unit 86. The timing control unit 86 controls the units 81-85 and their internal sub-circuits by a synchronization timing control approach, therefore, the timing control unit 86 needs an external clock signal and a sampling signal. The units 81, 82, 83, 84 and 86 are the same as or similar to the components of the above-mentioned embodiments.

The SA-ADC 85 includes a 2's complement generator 851, digital-to-analog converters (DACs) without sample/hold function 852 and 853, a comparator 854 and an SAR 857. The comparator 854 includes preamplifiers 855a and 855b, adders 856a and 856b and a latch unit 858. The comparator 854 has a deviation-correcting function. The coupling of internal components of the SA-ADC 85 can refer to FIG. 8, so it is omitted to describe.

Figure 9:
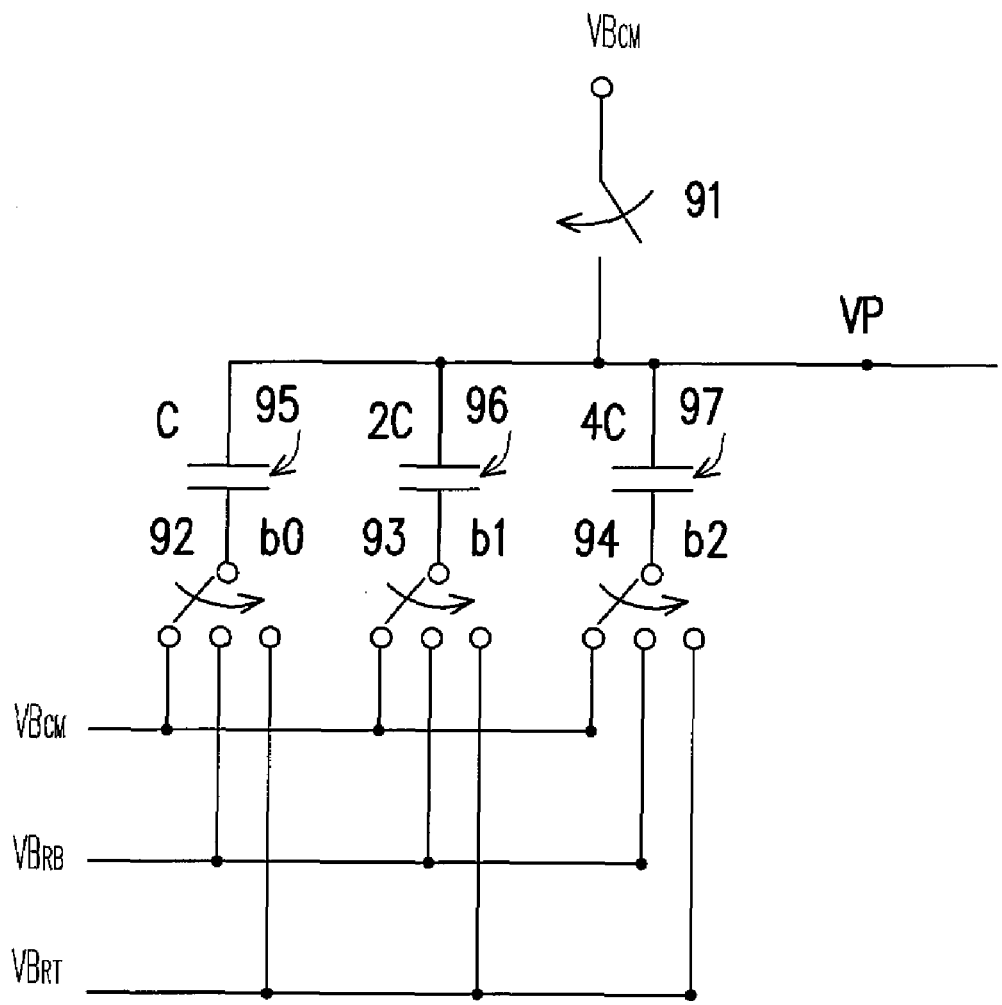
FIG. 9 is a diagram of the digital-to-analog converter without sample/hold function of FIG. 8.

Referring to FIG. 9, which is a diagram of the digital-to-analog converter without sample/hold function 852. The DAC 853 has the architecture same as or similar to the DAC 852.

As shown by FIG. 9, the DAC 852 includes switches 91-94 and capacitors 95-97. In the embodiment, the capacitances of the capacitors 95-97 are proportional in 1:2:4.

During the reset mode, the switch 91 is turned on and the switches 92-94 are connected to the common mode voltage $VB_{CM}$.

During data-converting, the switch 91 is turned off, while the switches 92, 93 and 94 would be switched to $VB_{RB}$ or $VB_{RT}$ according to the bits b0, b1 and b2. For example, when the bit b0 is 0, the switch 83 would be switched to $VB_{RB}$; otherwise, the switch 83 would be switched to $VB_{RT}$. The bits b0-b2 are LSBs.

From the architecture of FIG. 9, the voltage Vp can be expressed by:

$$Vp = \Delta V\_MSBs \times (\tfrac{1}{2} \times b2 + \tfrac{1}{4} \times b1 + \tfrac{1}{8} \times b0) + VB_{RB} \quad (2)$$

The above-mentioned embodiments are featured in low power consumption of the ADC circuit and an advanced data-converting speed, because in comparison with, for example, a conventional two-steps ADC architecture where the number of the comparators of the coarse ADCs and the fine ADCs are respectively ($2^{MSBs}-1$) and ($2^{LSBs}-1$), the number of the comparators inside the ADC in the embodiments is $2^{MSBs}$ only, which reduces the circuit complexity and the power consumption. Along with a reduced number of the comparators, the load capacitance of the T/H circuit may be largely lowered. In addition, the subranging technique reduces the DAC resolution inside the SA-ADC, thus, the charge redistribution time is shortened and the ADC data-converting speed is further advanced.

Along with low equivalent input capacitance, the present invention is allowed to adopt a charge scaling DAC architecture advantageous in easy implementation mapping and good accuracy (as shown by FIGS. 6 and 9).

In summary, the present embodiments are able to reach middle/high sampling frequency, low power consumption and reduced circuit complexity, so as to advance the chip fabrication yield and the area utilization ratio.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An analog-to-digital converting system, converting an analog input signal into a digital output signal, the analog-to-digital converting system comprising:
    a track and hold circuit for tracking the input signal during a track mode and holding the tracked input signal during a hold mode;
    a coarse analog-to-digital converter for converting an output signal of the track and hold circuit into a first digital code according to a first reference voltage, wherein the first digital code is related to a most-significant-bit set of the digital output signal of the analog-to-digital converting system;
    an encoding and registering unit for storing the first digital code and a second digital code, wherein the second digital code is related to a least-significant-bit set of the digital output signal of the analog-to-digital converting system and the encoding and registering unit encodes the first digital code into a third digital code;
    a reference voltage generator for generating the first reference voltage provided to the coarse analog-to-digital converter, wherein the reference voltage generator further generates a second reference voltage according to the third digital code encoded by the encoding and registering unit; and
    a successive approximation analog-to-digital converter, for receiving the output signal of the track and hold circuit, wherein the successive approximation analog-to-digital converter uses a successive approximation algorithm to convert the output signal of the track and hold circuit into the second digital code according to the second reference voltage.

2. The analog-to-digital converting system according to claim 1, further comprising:
    a timing control unit for controlling the track and hold circuit, the coarse analog-to-digital converter, the encoding and registering unit, the reference voltage generator and the successive approximation analog-to-digital converter.

3. The analog-to-digital converting system according to claim 1, wherein the first digital code is Gray code and the coarse analog-to-digital converter is a flash analog-to-digital converter.

4. The analog-to-digital converting system according to claim 1, wherein when the input signal is of a full-differential signal, the reference voltage generator further tracks a common mode voltage of the output signal of the track and hold circuit.

5. The analog-to-digital converting system according to claim 3, wherein the third digital code is 1-of-n code.

6. The analog-to-digital converting system according to claim 1, wherein when the input signal is of a full-differential signal, the successive approximation analog-to-digital converter comprises:
    a successive approximation register for outputting the second digital code and a fourth digital code;
    a 2's complement generator for generating a 2's complement of the fourth digital code;
    a first digital-to-analog converter with sample/hold function for generating a first analog voltage according to the output signal of the track and hold circuit, the second reference voltage and the fourth digital code;
    a second digital-to-analog converter with sample/hold function for generating a second analog voltage according to the output signal of the track and hold circuit, the second reference voltage and the 2's complement of the fourth digital code; and
    a comparator, receiving the first analog voltage and the second analog voltage respectively output from the first digital-to-analog converter with sample/hold function and the second digital-to-analog converter with sample/hold function so as to generate an output signal provided to both the successive approximation register and the 2's complement generator, wherein the output signal of the comparator is for updating the second digital code, the fourth digital code and the 2's complement of the fourth digital code.

7. The analog-to-digital converting system according to claim 6, wherein the comparator comprises:
    a preamplifier, receiving the first analog voltage and the second analog voltage respectively output from the first digital-to-analog converter with sample/hold function and the second digital-to-analog converter with sample/hold function; and
    a latch unit, receiving an output signal of the preamplifier to generate the output signal of the comparator.

8. The analog-to-digital converting system according to claim 1, wherein when the input signal is of a full-differential signal, the successive approximation analog-to-digital converter comprises:
    a successive approximation register for outputting the second digital code and a fourth digital code;
    a 2's complement generator for generating a 2's complement of the fourth digital code;

a first digital-to-analog converter for generating a first analog voltage according to the second reference voltage and the fourth digital code;

a second digital-to-analog converter for generating a second analog voltage according to the second reference voltage and the 2's complement of the fourth digital code; and a comparator for comparing the first analog voltage with the output signal of the track and hold circuit and the second analog voltage with the output signal of the track and hold circuit so as to generate an output signal provided both to the successive approximation register and the 2's complement generator, wherein the output signal of the comparator is for updating the second digital code, the fourth digital code and the 2's complement of the fourth digital code.

9. The analog-to-digital converting system according to claim 8, wherein the comparator comprises:

a first preamplifier, receiving the output signal from the track and hold circuit and the first analog voltage;

a second preamplifier, receiving the output signal from the track and hold circuit and the second analog voltage;

a first adder, receiving outputs of the first preamplifier and the second preamplifier;

a second adder, receiving outputs of the first preamplifier and the second preamplifier; and a latch unit, receiving outputs of the first adder and the second adder to generate the output signal of the comparator.

10. An analog-to-digital converting system, for converting a differential analog input signal into a digital output signal, the analog-to-digital converting system comprising:

a track and hold circuit for tracking the input signal and holding the tracked input signal;

a coarse analog-to-digital converter for converting an output signal of the track and hold circuit into a first digital code according to a first reference voltage, wherein the first digital code is related to a most-significant-bit set of the digital output signal of the analog-to-digital converting system;

an encoding and registering unit for storing the first digital code and a second digital code, wherein the second digital code is related to a least-significant-bit set of the digital output signal of the analog-to-digital converting system and the encoding and registering unit encodes the first digital code into a third digital code;

a reference voltage generator for generating the first reference voltage provided to the coarse analog-to-digital converter, wherein the reference voltage generator further generates a second reference voltage according to the third digital code; and a successive approximation analog-to-digital converter for converting the output signal of the track and hold circuit into the second digital code by using a successive approximation algorithm according to the second reference voltage, wherein the successive approximation analog-to-digital converter comprises:

a successive approximation register for outputting the second digital code and a fourth digital code;

a 2's complement generator for generating a 2's complement of the fourth digital code;

a first digital-to-analog converter with sample/hold function for generating a first analog voltage according to the output signal of the track and hold circuit, the second reference voltage and the fourth digital code;

a second digital-to-analog converter with sample/hold function for generating a second analog voltage according to the output signal of the track and hold circuit, the second reference voltage and the 2's complement of the fourth digital code; and a comparator, receiving outputs from the first digital-to-analog converter with sample/hold function and the second digital-to-analog converter with sample/hold function to generate an output signal provided to the successive approximation register and the 2's complement generator, wherein the output signal of the comparator is for updating the second digital code, the fourth digital code and the 2's complement of the fourth digital code.

11. The analog-to-digital converting system according to claim 10, wherein the comparator comprises:

a preamplifier, receiving the first analog voltage and the second analog voltage respectively output from the first digital-to-analog converter with sample/hold function and the second digital-to-analog converter with sample/hold function; and a latch unit, receiving an output signal of the preamplifier to generate the output signal of the comparator.

12. The analog-to-digital converting system according to claim 10, further comprising:

a timing control unit for controlling the track and hold circuit, the coarse analog-to-digital converter, the encoding and registering unit, the reference voltage generator and the successive approximation analog-to-digital converter.

13. The analog-to-digital converting system according to claim 10, wherein the first digital code is Gray code and the coarse analog-to-digital converter is a flash analog-to-digital converter.

14. The analog-to-digital converting system according to claim 10, wherein the reference voltage generator further tracks a common mode voltage of the output signal of the track and hold circuit.

15. The analog-to-digital converting system according to claim 13, wherein the third digital code is 1-of-n code.

16. An analog-to-digital converting system, for converting a differential analog input signal into a digital output signal, the analog-to-digital converting system comprising:

a track and hold circuit for tracking the input signal and holding the tracked input signal;

a coarse analog-to-digital converter for converting an output signal of the track and hold circuit into a first digital code according to a first reference voltage, wherein the first digital code is related to a most-significant-bit set of the digital output signal of the analog-to-digital converting system;

an encoding and registering unit for storing the first digital code and a second digital code, wherein the second digital code is related to a least-significant-bit set of the digital output signal of the analog-to-digital converting system and the encoding and registering unit encodes the first digital code into a third digital code;

a reference voltage generator for generating the first reference voltage provided to the coarse analog-to-digital converter, wherein the reference voltage generator further generates a second reference voltage according to the third digital code; and a successive approximation analog-to-digital converter for converting the output signal of the track and hold circuit into the second digital code by using a successive approximation algorithm according to the second reference voltage, wherein the successive approximation analog-to-digital converter comprises:
  a successive approximation register for outputting the second digital code and a fourth digital code;
  a 2's complement generator for generating a 2's complement of the fourth digital code;
  a first digital-to-analog converter for generating a first analog voltage according to the second reference voltage and the fourth digital code;
  a second digital-to-analog converter for generating a second analog voltage according to the second reference voltage and the 2's complement of the fourth digital code; and
  a comparator for comparing the first analog voltage with the output signal of the track and hold circuit and for comparing the second analog voltage with the output signal of the track and hold circuit so as to generate an output signal provided to the successive approximation register and the 2's complement generator, wherein the output signal of the comparator is for updating the second digital code, the fourth digital code and the 2's complement of the fourth digital code.

17. The analog-to-digital converting system according to claim 16, wherein the comparator comprises:
  a first preamplifier, receiving the output signal of the track and hold circuit and the first analog voltage;
  a second preamplifier, receiving the output signal of the track and hold circuit and the second analog voltage;
  a first adder, receiving outputs of the first preamplifier and the second preamplifier;
  a second adder, receiving outputs of the first preamplifier and the second preamplifier; and
  a latch unit, receiving outputs of the first adder and the second adder to generate the output signal of the comparator.

18. The analog-to-digital converting system according to claim 16, further comprising:
  a timing control unit for generating a control signal provided to the track and hold circuit, the reference voltage generator, the coarse analog-to-digital converter, the successive approximation analog-to-digital converter and the encoding and registering unit.

19. The analog-to-digital converting system according to claim 16, wherein the first digital code is Gray code, the coarse analog-to-digital converter is a flash analog-to-digital converter and the third digital code is 1-of-n code.

20. The analog-to-digital converting system according to claim 16, wherein the reference voltage generator further tracks a common mode voltage of the output signal of the track and hold circuit.

* * * * *